United States Patent [19]

D'Asaro et al.

[11] 4,162,337

[45] Jul. 24, 1979

[54] PROCESS FOR FABRICATING III-V SEMICONDUCTING DEVICES WITH ELECTROLESS GOLD PLATING

[75] Inventors: Lucian A. D'Asaro; Yutaka Okinaka, both of Madison, N.J.

[73] Assignee: Bell Telephone Laboratories, Incorporated, Murray Hill, N.J.

[21] Appl. No.: 851,612

[22] Filed: Nov. 14, 1977

[51] Int. Cl.$^2$ .............................................. C23C 3/02
[52] U.S. Cl. ..................... 427/92; 106/1.11; 106/1.23; 106/1.26; 204/38 B; 204/32 S; 427/87; 427/125; 427/304; 427/309; 427/299; 156/643
[58] Field of Search ................. 427/92, 125, 299, 304, 427/309, 98, 39, 87; 106/1.11, 1.23, 1.26; 204/38 B, 32 S; 156/643

[56] References Cited

U.S. PATENT DOCUMENTS

| | | | |
|---|---|---|---|
| 2,995,473 | 8/1961 | Levi | 427/92 |
| 3,214,292 | 10/1965 | Edson | 106/1.26 |
| 3,349,476 | 10/1967 | Pilkuhn et al. | 427/92 |
| 3,428,474 | 2/1969 | Hensler et al. | 427/39 |
| 3,485,665 | 12/1969 | DeAngelo et al. | 427/305 |
| 3,700,469 | 10/1972 | Okinaka | 106/1.26 |
| 3,808,028 | 4/1974 | Lando | 427/92 |
| 3,917,885 | 11/1975 | Baker | 427/305 |

OTHER PUBLICATIONS

Logan et al., *Journal of the Electrochemical Society,* vol. 120, pp. 1385–1390, Oct. 1973.
Evmanis et al., *Journal of the Electrochemical Society,* vol. 121, pp. 1665–1667, Dec. 1974.
Ikving, Solid State Technology, Jun. 1971.

*Primary Examiner*—John D. Smith
*Attorney, Agent, or Firm*—Walter G. Nilsen

[57] ABSTRACT

A process is described for making III–V semiconductor devices with electroless gold plated layers. Various III–V semiconductors are used, particularly those containing gallium, aluminum and indium such as GaAs, $Al_xGa_{1-x}As$, GaP, $Al_xGa_{1-x}P_yAs_{1-y}$, $In_xGa_{1-x}P_yAs_{1-y}$ and InP. This process involves activation of a semiconductor surface and then electrolessly gold plating the surface. Electroless gold films produced in accordance with this process have good adherence to the semiconductor surface and are useful not only for electrical connection to the semiconductor, but also for attachment to headers for mechanical convenience and to maintain temperature stability. Exemplary devices are field effect transistors, particularly those operating in the microwave region, and semiconductor lasers.

20 Claims, 3 Drawing Figures

PROCESS FOR FABRICATING III-V SEMICONDUCTING DEVICES WITH ELECTROLESS GOLD PLATING

BACKGROUND OF THE INVENTION

1. Field of the Invention

The invention involves a process for making semiconductor devices with electroless gold layers.

2. Description of the Prior Art

Gold is extensively used in semiconductor devices both as an electrical connection to the semiconductor (for example, as an electrode) and as a heat conducting path for attachment to a heat sink. Advantages in the use of gold are high electrical and heat conductivity, good solderability, freedom from surface corrosion and long-term stability. In the fabrication of semiconductor devices, it is highly desirable to have good adherence of the gold film to the semiconductor surface and that the good adherence remain stable with time. It is also desirable that under manufacturing conditions, the gold film be applied rapidly, simply and inexpensively. Conventionally, gold films are made by evaporation onto the semiconductor surface. Often, chromium or titanium are used as undercoats to insure good adhesion of the gold film to the semiconductor surface. Although these methods often yield perfectly satisfactory results, it is highly desirable to have simpler, less expensive and more reproducible procedures for making adherent gold films. For example, evaporation procedures require vacuum conditions which greatly complicate commercial manufacturing procedures. The need for simpler procedures is particularly evident for electronic and laser applications where masking and etching procedures are used and where small dimensions and close tolerances are characteristic of the device. Formulations for electroless gold baths are known as well as procedures for applying electroless gold to catalytic surfaces (see U.S. Pat. No. 3,700,469).

SUMMARY OF THE INVENTION

The invention is a process for fabricating semiconductor devices with gold films made by a particular activation and electroless gold plating process. Semiconductor compounds in the III-V group which contain gallium, aluminum or indium are particularly included as for example GaAs, $Al_xGa_{1-x}As$, $Al_xGa_{1-x}P_yAs_{1-y}$, $In_xGa_{1-x}P_yAs_{1-y}$, GaP, and InP. The process involves surface cleaning and then activation followed by electroless gold plating. Cleaning may be conventional, but a specific procedure involving plasma cleaning is often preferred. Activation involves use of an acid solution of activator species in water or weak acid. Various activator species are useful including gold containing ions and platinum containing ions, but palladium containing ions are preferred because of their excellent catalyzing properties for electroless plating solutions. In addition, hydrofluoric acid is used in the activation solution. Concentrations between 0.1 weight percent and 50 weight percent show good results. Preferred activation procedures depend to some extent on the semiconductor surface being activated particularly as to the solvent used in the activation solution. Activation is carried out by wetting the surface to be electrolessly plated with activator solution. Preferred times for activation are between one minute and five minutes both for convenience and to insure complete activation. Activation is followed by rinsing, preferably in distilled, deionized water, and then immersion in the plating bath. Various electroless plating baths may be used including those set forth by K. D. Baker in U.S. Pat. No. 3,917,885 issued Nov. 4, 1975 and set forth by Y. Okinaka in "Electroless Solutions" published in *Gold Plating Technology* edited by Frank H. Reid and William Goldie, Electrochemical Publications Limited, Scotland, 1974, Chapter 11. The preferred plating bath is composed of a soluble gold cyanide complex, excess free cyanide ion, reducing agent such as borohydride or aliphatic amine borane and an alkaline agent to increase pH. Although the electroless plating may be carried out at any temperature between the freezing point and the boiling point of the plating solution, a temperature between 60 degrees and 95 degrees C. yields good results. The process is simple, inexpensive and rapid. It is easily adapted to the technology used to produce integrated circuits and semiconductor lasers. The resulting gold films exhibit exceptionally good adherence so that devices produced in accordance with the invention exhibit good temperature stability when attached by means of the gold films to heat sinks, exhibit good electrical contact to the semiconductor and produce good mechanical bonds when attached through the gold plated surface to headers or other mechanical mounting structures.

DETAILED DESCRIPTION

Figure 1:
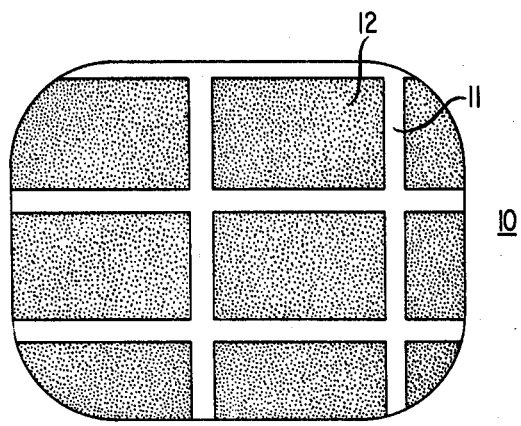
FIG. 1 shows a top view of bonding pads formed by electroless gold plating on the back of a wafer of GaAs to be used for field-effect transistors.

The invention applies generally to devices having gold films on surfaces of III-V semiconductor compounds. In particular, the invention applies to III-V compounds which contain gallium, indium or aluminum, including III-V compounds containing more than one of these elements. Examples are gallium arsenide, aluminum arsenide and gallium aluminum arsenide with nominal formula $Al_xGa_{1-x}As$ with values of x ranging from 0 to 1. The invention also applies to gallium phosphide and indium phosphide as well as such mixed compounds (or solid solutions) as $Al_xGa_{1-x}P_yAs_{1-y}$ and $In_xGa_{1-x}P_yAs_{1-y}$.

The initial step in the process involves cleaning the surface prior to activation. Generally, the cleaning procedure aims primarily toward removing oxide contaminants from the surface of the semiconductor and to some extent toward removing other contaminants (e.g., organic contaminants) from near the surface. Oxide removal from the surface of the semiconductor is achieved in a large variety of ways including mechanical means (e.g., rubbing the surface) and chemical means (e.g., acid rinse). A useful mechanical procedure is surface polishing under conditions where semiconductor oxide does not reform after removal (under inert atmosphere or in a liquid that prevents oxide formation). Also, chemical cleaning with substances that remove the semiconductor oxide (e.g., aqueous non-oxidizing acids such as aqueous HCl or aqueous non-oxidizing bases such as ammonium hydroxide) is useful. Naturally, a variety of non-oxidizing acids may be used in addition to aqueous HCl including hydrofluoric acid, etc. Other aqueous bases are also useful including KOH, etc. The HCl and NH$_4$OH are preferred because of easy availability, freedom from contaminating elements and the fact that they evaporate without leaving a residue. Descriptive material relative to oxide removal from some III-V compounds is found in two literature articles: Logan et al, *J. Electrochem. Soc.* 120, 1385-1390 (1973) and Evmanis et al, *J. Electrochem. Soc.* 121, 1665-1667 (1974).

In addition, plasma cleaning particularly when used in conjunction with oxide removal procedures described above improves results especially in regard to adherence of the gold layer to the semiconductor surface. Plasma cleaning is believed to remove principally organic contaminants and perhaps other oxidizable contaminants adsorbed on the surface of the semiconductor. Its advantage is oxidation and removal of contaminants at low temperatures so as to insure good adherence of the gold film without exposing the semiconductor to high temperatures. Plasma oxidation processes are described by Irving in *Solid State Technology*, June 1971. Generally, oxygen atoms or a mixture of oxygen and inert atoms (e.g., rare gases, etc.) are used in the plasma discharge. Often, plasma cleaning is advantageous over chemical cleaning methods because it reduces the chances of undesirable contamination.

After cleaning, the surface is activated using an acid solution of activating ions and hydrofluoric acid. The solvent for the acid solution may be water, a weak acid or a mixture of such substances. The weak acid should be liquid under conditions where the sensitization is carried out. Typical weak acids are organic acids with up to three carbon atoms. Glacial acetic acid is preferred because of easy availability, low cost and good results obtained. Although the mechanism involved is not completely understood, it is believed that the weak acid moderates the attack of hydrofluoric acid on the semiconductor surface without significantly decreasing its attack on surface oxides on the semiconductor. Activating species may be gold chloride, platinum chloride or palladium chloride. Although the exact nature of the ionic species responsible for activation is not known, gold chloride probably exists as $AuCl_4^-$ in acid solution and platinum chloride as $PtCl_6^=$ in acid solution. Preferred composition of the activation solution depends on the particular compound semiconductor being activated. Generally, for the arsenide compounds some glacial acetic acid is used, whereas for the phosphide compounds water is used as the solvent. It is advantageous to protect the semiconductor surface after cleaning from restoration of the oxide film either by minimizing the time between cleaning and activation or protecting the surface in other ways. Activation is preferably carried out for one to five minutes, generally at room temperatures. Elevated temperatures (generally 40 to 90 degrees C.) are used where it is more difficult to achieve activation such as is the case of indium phosphide. After activation, the surface may be rinsed to remove excess activation solution.

It should be remarked that the activation may be carried out by a two step process. The first step involves chemical treatment of the semiconductor surface, for example by an HF solution in water or a weak acid. Other chemical treatments may be used, such as aqueous alkali hydroxide, acidified HF solutions such as nitric acid and hydrofluoric acid solution. The surface is then exposed to an aqueous acid solution of sensitizing ion such as palladium, gold or platinum. See for example M. A. DeAngelo et al, U.S. Pat. No. 3,485,665, issued Dec. 23, 1969. This procedure might have advantages in certain situations, but it is generally preferred to use a one step process (chemical treatment ion and activator ion in same solution) since it removes the danger of surface contamination in going from the chemical treatment step to the activator step. In the one step procedure, the chemical treatment substance and activator substance should be compatible.

A wide range of concentrations is useful for the activation solution. Preferred concentrations for activating species is from 0.0002 M to saturation or 0.2 M. Lower concentrations yield satisfactory results but usually require inconveniently long periods of time to achieve activation. High concentrations are wasteful of material and yield no apparent advantages. A concentration range from 0.001 to 0.003 M yields excellent results. The activation solution should be acidic, preferably with HCl although other acids including sulfuric acid and nitric acid are useful. Hydrogen fluoride is also useful in the activation solution. Generally, a concentration range from 0.001 to 0.1 M yields good results. Particular III-V semiconductors have more advantageous concentration ranges. The solvent for the activation solution contains at least one percent by weight of water. Usually, it ranges from 10 percent to 100 percent by weight water, remainder weak acid. Preferably, the weak acid is glacial acetic acid. Semiconductors containing arsenic usually require more glacial acetic acid; those with only phosphorus as group V element require a higher percentage of water. Specific compositions for various III-V semiconductors are given below.

After activation and optional rinsing, the semiconductor surface is electrolessly gold plated by immersion in a suitable plating solution. Various electroless gold plating procedures may be used. Excellent results in terms of plating rate, thickness and gold-film adherence are obtained using the procedure and electroless plating solution given below. Although any temperature between the freezing temperature and the boiling temperature of the plating solution may be used, a temperature in the range between 60 and 95 degrees C. is preferred because it gives reasonable plating rates without the danger of excessive solution decomposition. In general terms, the composition of the electroless gold plating solution may be described as the use of free cyanide ions to stabilize $Au(CN)_2^-$ complex and the use of a reducing agent such as borohydride or aliphatic-substituted amine borane. The cation of the borohydride should be one that does not interfere with the plating mechanism of the electroless plating solution. The reducing agent should be reasonably soluble in the electroless plating solution. Although wide variations in composition yield satisfactory results for many purposes, the preferred composition ranges of a suitably stabilized bath are as follows:

(1) Soluble gold cyanide complex (e.g., $KAu(CN)_2$, $NaAu(CN)_2$, and $LiAu(CN)_2$), 0.0002 M to 0.05 M.

(2) Excess free cyanide ion to stabilize the gold cyanide complex (e.g., KCN, NaCN). In terms of the molar ratio of free cyanide ion to gold cyanide complex, a minimum ratio of 0.05 applies to the entire compositional range of gold complex given above; but the maximum ratio is 2000 at 0.0002 M gold cyanide complex and decreases linearly to 20 as the concentration of gold complex increases to 0.05 M.

For low concentrations of free cyanide, the shelf life of the plating bath is inconveniently short for some applications. In this case, the minimum ratio should be 50 at 0.0002 M gold cyanide complex and should decrease linearly to 0.2 as the concentration of gold complex increases to 0.05 M.

(3) Reducing agent such as a borohydride or an amine borane with up to six carbon atoms (e.g., $KBH_4$, $(CH_3)_2NH \cdot BH_3$), 0.05 M to 1 M.

(4) Alkaline agent such as alkali-metal hydroxide (e.g., NaOH, KOH) in terms of molar ratio of hydroxyl-ion to reducing agent concentration, 0.1 to 5.

In addition, other reagents may be added to the plating solution in order to improve the properties of the plating for certain applications, for example, certain metal ions may be added to alloy the gold plating.

The reasons for the limits in composition are discussed. The gold cyanide complex extends from a minimum concentration which yields reasonable plating rates to a concentration above which no improvement in bath characteristics is obtained. For the free cyanide ion, the limits of composition are expressed as a ratio of molar concentration of cyanide ion to gold cyanide complex ion. Too low a ratio results in spontaneous reduction of the gold ions. Too high a ratio is not a useful improvement since the stability is already sufficient for practical applications and plating rate is further reduced. Too low a concentration of a reducing agent reduces the plating rate to where it is no longer useful and exceeding the maximum concentration makes the plating bath unstable. The hydroxyl ion is used to stabilize the plating bath in the case of the borohydride and to increase the reducing activity in the case of an aliphatic-substituted amine borane. It is appropriate to express the hydroxyl-ion concentration as a ratio of molar concentration of the hydroxyl ion to a reducing agent. In the case of a borohydride, too low a ratio makes the borohydride unstable; too high a ratio makes the plating rate inconveniently slow. For the substituted amine borane, the ratio extends from a minimum which yields reasonable plating rates to a maximum above which no improvement in bath characteristics is obtained.

A preferred composition for the electroless gold is within a range of ±50 percent as follows:
$KAu(CN)_2$: 0.003 M
KOH: 0.2 M
KCN: 0.1 M
$KBH_4$: 0.2 M In some cases, it might be desirable to obtain a thicker gold layer than is conveniently obtained using the electroless gold plating procedure. In these cases, the gold plating may be thickened by well-known gold electroplating procedures.

It is useful to illustrate the invention by a number of specific examples using particular III-V semiconductors.

EXAMPLE 1

GaAs

The semiconductor material is first shaped and mounted if necessary. In many applications the surface is polished, typically using a five percent by weight solution of bromine in methyl alcohol. This is followed by an acid rinse using aqueous HCl. After drying, the surface is subjected to an rf plasma cleaning procedure using three percent oxygen and 97 percent helium at a power of 50 watts for five minutes. The surface is then activated by exposure to an activation solution for at least one minute. The activation solution is made by dissolving 0.3 grams of palladium chloride in 9 ml. of concentrated HCl and 9 ml. of water. This solution is added to 864 ml. of glacial acetic acid, and to this solution is added 18 ml. of hydrofluoric acid (49 percent). The resulting solution should be thoroughly mixed. For purposes outlined herein, variations in composition of ±50 percent yield equivalent results. After activation the semiconductor is thoroughly rinsed in distilled deionized water and then immersed in the plating bath. The plating bath is maintained at approximately 70 degrees C. during plating. The sample is agitated in the plating bath so as to obtain uniform and rapid plating. It is generally preferred that the sample be moved relative to the plating solution rather than agitating the entire plating solution. The plating rate is approximately one micron of gold in 40 minutes under these conditions. In some cases it is useful to inspect the sample after 10 or 15 minutes and to reactivate any spots on the surface which are not plating. The plating proceeds equally well in n-type or p-type semiconductor material, as well as undoped semi-insulating crystals. This procedure yields excellent gold films with good adherence and good electrical contact. Additional gold may be put on the gold layer by gold electrodeposition procedures.

EXAMPLE 2

$Al_xGa_{1-x}As$

This semiconductor with x equal to 0.4 was electrolessly gold plated using the same procedure as in example 1. Generally, this procedure is useful for III-V semiconductors containing at least 10 mole percent arsenic.

EXAMPLE 3

GaP

This semiconductor was electrolessly gold plated using the same procedure as above, except that water was substituted for glacial acetic acid. It is believed that this change in composition increases the effectiveness of the hydrogen fluoride in removing oxide layers on the GaP.

EXAMPLE 4

InP

This semiconductor was electrolessly gold plated as in example 1 above except that the activative solution was made by dissolving 0.3 grams palladium chloride in 9 ml. concentrated HCl and diluting with 783 ml. water. To this solution was added 90 ml. HF (49 percent) and the solution mixed. Activation is carried out between 40 and 90 degrees C. (preferably 50 degrees C.) for 1-60 minutes (preferably two minutes).

FIG. 1 shows the back side of a GaAs chip 10 showing masking strips 11 (typically made with negative photoresist) which separate individual devices and electroless gold platings 12 which after further processing are attached (soldered or placed) to headers for mechanical convenience, heat sinking and possibly electrical connection.

Figure 2:
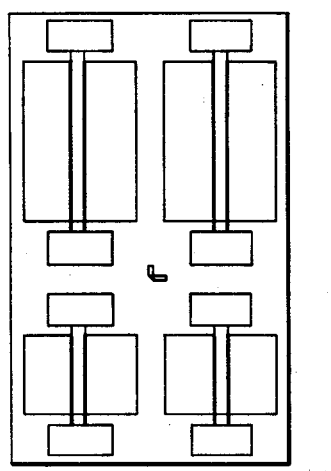
FIG. 2 shows a top view of the electrodes of low noise GaAs field-effect transistors located on the opposite side from the bonding pads shown in FIG. 1.
Figure 2:
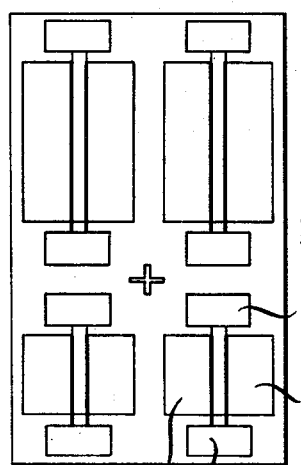
Figure 2:
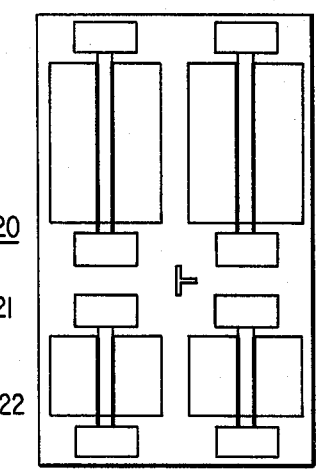
Figure 2:
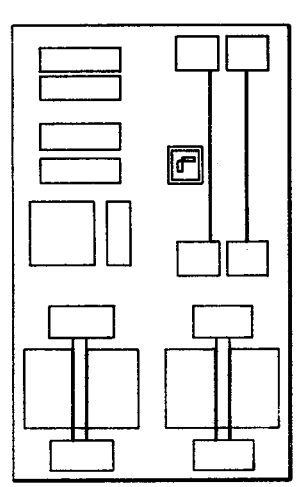
Figure 2:
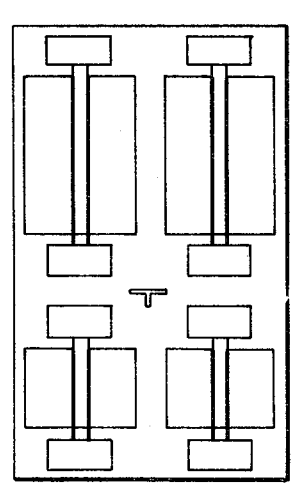
Figure 2:
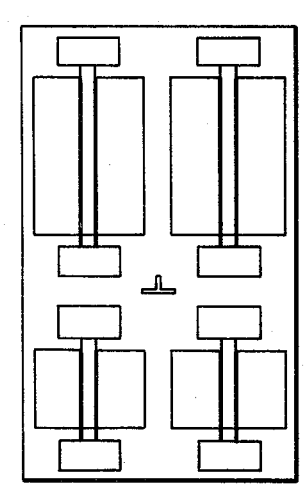

FIG. 2 shows the front side of the group of field-effect transistors 20 shown in FIG. 1 with drain pad 21, source pad 22 and gate pad 23.

Figure 3:
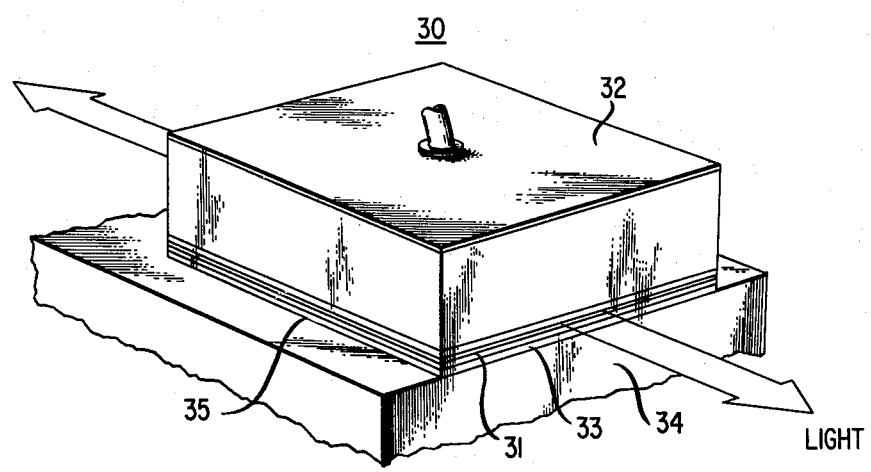
FIG. 3 shows a perspective view of a double-heterostructure laser with gold layers put down with the inventive process on bottom and top for attachment of semiconductor to a heat sink and electrical connector.

FIG. 3 shows an aluminum gallium arsenide laser 30 with various semiconductor layers 31, electrode on semiconductor 32 and metal layer 33 for connection to heat sink 34. The electrical and mechanical connection to the heat sink 34 is advantageously made through an electrolessly plated gold layer 33 on the bottom semiconductor layer 35. Also, the electrode 32 on the top semiconductor is advantageously made by the electroless gold plating procedure. Additional gold may be added by, for example, electrolytic gold deposition.

What is claimed is:

1. A process for fabricating III–V semiconductor devices with at least one gold plated surface in which the III–V semiconductor comprises at least one element selected from the group consisting of gallium, aluminum and indium characterized in that the process comprises the steps of
   (a) activating at least one surface of a III–V semiconductor using an acid solution of hydrofluoric acid and activator species containing at least one ion selected from the group consisting of gold, platinum and palladium and solvent consisting of at least one substance selected from the group consisting of water and weak organic acid with up to three carbon atoms; and
   (b) exposing the activated surface to an electroless gold plating solution so as to produce a gold layer on the III–V semiconductor surface.

2. The process of claim 1 in which the weak acid is acetic acid.

3. The process of claim 2 in which the solvent consists essentially of from 10 to 100 weight percent water, remainder acetic acid.

4. The process of claim 3 in which the activation species contains palladium ions.

5. The process of claim 1 in which the concentration of activator species is from 0.0002 M to 0.2 M.

6. The process of claim 5 in which the concentration range is from 0.001 M to 0.003 M.

7. The process of claim 1 in which the concentration of hydrofluoric acid is from 0.001 M to 0.1 M.

8. The process of claim 1 in which the activation solution is made acidic with aqueous hydrochloric acid.

9. The process of claim 1 in which the electroless gold plating solution is maintained at a temperature between 60 and 95 degrees C. during the electroless plating.

10. The process of claim 9 in which the electroless gold plating solution consists essentially of a soluble gold cyanide complex ion in the concentration range of 0.0002 M to 0.05 M; excess free cyanide to stabilize the gold cyanide complex ion with molar ratio of free cyanide to gold cyanide complex which is from a minimum of 0.05 for the entire compositional range of the gold cyanide complex to a maximum which is 2000 at 0.0002 M gold cyanide complex and which decreases linearly to 20 at 0.05 M gold cyanide complex; a reducing agent selected from the group consisting of alkali-metal borohydrides and amine borane with up to 6 carbon atoms in the concentration range of 0.05 M to 1 M; and an alkaline agent which yields a molar concentration ratio of hydroxyl-ion to reducing agent in the range of 0.1 to 5.

11. The process of claim 10 in which the electroless gold plating solution consists essentially of:

| | | |
|---|---|---|
| $KAu(CN)_2$ | 0.003M | ±50 percent |
| KOH | 0.2M | ±50 percent |
| KCN | 0.1M | ±50 percent |
| $KBH_4$ | 0.2M | ±50 percent |

12. The process of claim 1 in which the surface of the III–V semiconductor is cleaned by a process that removes oxide surface layers prior to activation.

13. The process of claim 11 in which the surface of the III–V semiconductor is cleaned by first exposure to an acid solution and then by plasma cleaning.

14. The process of claim 1 in which the III–V semiconductor contains at least 10 mole percent arsenic and the activator solution within a concentration range of ±50 percent consists essentially of:
   a. 0.3 gms palladium chloride
   b. 9 ml concentrated HCl
   c. 9 ml water
   d. 864 ml glacial acetic acid
   e. 18 ml hydrofluoric acid (49 weight percent).

15. The process of claim 14 in which the III–V semiconductor is gallium arsenide.

16. The process of claim 14 in which the III–V semiconductor is gallium aluminum arsenide.

17. The process of claim 1 in which the III–V semiconductor is gallium phosphide and the activator solution within a concentration range of ±50 percent consists essentially of:
   a. 0.3 gms palladium chloride
   b. 9 ml concentrated HCl
   c. 873 ml water
   d. 18 ml hydrofluoric acid (49 weight percent).

18. The process of claim 1 in which the III–V semiconductor is indium phosphide and the activator solution within a concentration range of ±50 percent consists essentially of
   a. 0.3 gms palladium chloride
   b. 9 ml concentrated HCl
   c. 783 ml water
   d. 90 ml hydrofluoric acid (49 weight percent).

19. The process of claim 18 in which the activation step is carried out at a temperature between 40 and 90 degrees C.

20. The process of claim 1 in which subsequent to electroless gold plating the semiconductor surface additional gold is added by electrodeposition.

* * * * *